(12) United States Patent
Soika et al.

(10) Patent No.: US 10,531,595 B2
(45) Date of Patent: Jan. 7, 2020

(54) ARRANGEMENT FOR SUPPLYING POWER TO A MOTOR VEHICLE EQUIPPED WITH AN ELECTRIC MOTOR

(71) Applicant: NEXANS, Courbevoie (FR)

(72) Inventors: Rainer Soika, Donaueschingen (DE); Helmut Steinberg, Störnstein (DE)

(73) Assignee: NEXANS, Courbevoie (FR)

( * ) Notice: Subject to any disclaimer, the term of this patent is extended or adjusted under 35 U.S.C. 154(b) by 123 days.

(21) Appl. No.: 15/843,996

(22) Filed: Dec. 15, 2017

(65) Prior Publication Data

US 2018/0206364 A1    Jul. 19, 2018

(30) Foreign Application Priority Data

Dec. 20, 2016 (EP) .................................... 16306743

(51) Int. Cl.
*H01M 10/46* (2006.01)
*H05K 7/20* (2006.01)
*H01B 12/16* (2006.01)

(52) U.S. Cl.
CPC ......... *H05K 7/20272* (2013.01); *H01B 12/16* (2013.01); *H05K 7/20236* (2013.01)

(58) Field of Classification Search
CPC ........ H02J 7/355; H02J 7/0042; H02J 7/1453; H01B 12/00; H01B 12/16
USPC ...... 320/104, 109, 150, 153; 174/15.4, 15.5, 174/15.6
See application file for complete search history.

(56) References Cited

U.S. PATENT DOCUMENTS

| | | | |
|---|---|---|---|
| 2005/0079980 A1 | 4/2005 | Hirose | |
| 2010/0104935 A1* | 4/2010 | Hermann | H01M 10/625 429/120 |

FOREIGN PATENT DOCUMENTS

| | | |
|---|---|---|
| CN | 105845271 | 8/2016 |
| DE | 1948520 | 4/1971 |
| DE | 202009010275 | 10/2009 |
| WO | 0225672 | 3/2002 |

OTHER PUBLICATIONS

International Search Report dated May 31, 2017.
Michael J. Jefferies et al. "High-Voltage Testing of a High-Capacity, Liquid-Nitrogen Cooled Cable", IEEE Transactions on Power Apparatus and Systems, IEEE Inc. NY, US; NR. 2, Mar. 1973.

* cited by examiner

*Primary Examiner* — Edward Tso
(74) *Attorney, Agent, or Firm* — Sofer & Haroun, LLP

(57) ABSTRACT

Specified is an arrangement for supplying power to a motor vehicle which is equipped with an electric motor and in which there is arranged at least one rechargeable electric battery to which the electric motor is connected. The arrangement includes a stationary charging station which is equipped with an electric power source and to which an electric line having at least two mutually insulated electrical conductors is connected, a part of an electrical coupling for connecting to a complementary coupling part present on or in the motor vehicle being attached to the free ends of said electrical conductors, said coupling part being connected to the battery in an electrically conductive manner. The electric line is surrounded along its entire axial length by a thermally insulated and flexible tube made of metal which is closed all around and which, in addition to the line, encloses a cavity along its entire axial length. A flowable medium refrigerated to a temperature of at least −160° C. is contained in the space enclosed by the tube, and a thermally insulated storage tank containing a store of the refrigerated medium is arranged in the charging station, the tube being connected to said storage tank.

2 Claims, 3 Drawing Sheets

ARRANGEMENT FOR SUPPLYING POWER TO A MOTOR VEHICLE EQUIPPED WITH AN ELECTRIC MOTOR

RELATED APPLICATION

This application claims the benefit of priority from European Patent Application No. 16 306 743.2, filed on Dec. 20, 2016, the entirety of which is incorporated by reference.

FIELD OF THE INVENTION

The invention relates to an arrangement for supplying power to a motor vehicle which is equipped with an electric motor and in which there is arranged at least one rechargeable electric battery to which the electric motor is connected, said arrangement including a stationary charging station which is equipped with an electric power source and to which an electric line having at least two mutually insulated electrical conductors is connected, a part of an electrical coupling for connecting to a complementary coupling part present on or in the motor vehicle being attached to the free ends of said electrical conductors, said coupling part being connected to the battery in an electrically conductive manner, wherein the electric line is surrounded along its entire axial length by a tube which is closed all around and which, in addition to the line, encloses a cavity along its entire axial length, wherein a flowable medium refrigerated to a temperature of at least −160° C. is contained in the space enclosed by the tube, and wherein a thermally insulated storage tank containing a store of the refrigerated medium is arranged in the charging station, the tube being connected to said storage tank.

Such an arrangement is disclosed for example in CN 105 845 271 A.

DESCRIPTION OF RELATED ART

Motor vehicles—referred to as "vehicles" for short below—which have an electric motor as drive have been known for years and used worldwide. In this case, the electric motor can be the only drive for a vehicle. However, in the likewise known hybrid technology, in addition to the electric motor, it is also possible for a combustion engine to be arranged in a vehicle. Both drives are generally selectively used separately from one another. However, they can also be used simultaneously—for example on mountain routes.

For operating the electric motor, at least one rechargeable electric battery is present in the vehicles. For a corresponding charging operation, charging stations are known and likewise in use worldwide. The charging stations are equipped with an electric cable which has a plug at its free end for connecting to a vehicle. The electric voltage provided in the charging station is 48 volts in modern installations. Electric current at a level of for example 5 kA is transmitted by the conductors of the line connected to the charging station. The electrically conductive cross sections of the conductors have to have a corresponding size. This requires considerable amount on electrically conductive material, such as copper or aluminium. The line connected to a charging station therefore has a considerable weight. The handling of said line for connecting to the complementary coupling part of the vehicle can accordingly lead to problems.

CN 105 845 271 A, mentioned at the beginning, relates to a charging station for supplying power to motor vehicles having an electric motor, said charging station containing a tank with liquid nitrogen, into which a supply line dips. A superconductive cable is connected to the supply line via a plug connection, said cable being fitted, together with other cables or lines, in a tube that consists of insulating material. The liquid nitrogen is passed into the tube such that the enclosed cable is cooled down to −195.5° C. The superconductive cable as a result becomes the superconductive state.

OBJECTS AND SUMMARY

The invention is based on the object of configuring the arrangement outlined at the beginning in such a way that it is easier to handle the line connected to a charging station and to connect it to a vehicle for a charging operation.

This object is achieved according to the invention
in that the tube is a thermally insulated and flexible tube made of metal,
in that the tube is surrounded by a flexible outer tube that likewise consists of metal, with thermal insulation being enclosed therein,
in that the space between the tube and outer tube is evacuated,
in that the tube and the outer tube are corrugated transversely to their longitudinal direction,
in that a pump for moving the refrigerated medium through the tube is arranged in the charging station, and
in that the tube is equipped with an empty tube for returning the refrigerated medium to the charging station.

The value of the electrical resistance of the electrical conductor at a temperature of −160° C. is only about 10% of the value at normal ambient temperature. The amount on conductive material for the electrical conductors of the line can therefore be reduced substantially. Including the insulated tube surrounding the conductors, the weight of the line is only about 20% of a conventional line. It can therefore be handled more easily and with much less effort.

For improved thermal insulation, the tube of the line is enlarged to form a cryostat, since a flexible outer tube that likewise consists of metal is arranged around said tube, with thermal insulation being enclosed therein. The intermediate space between the tube and outer tube is evacuated. Over the outer tube, a closed layer of insulating material is expediently applied. In order to improve their flexibility, both tubes are corrugated transversely to their longitudinal direction, specifically helically or annularly.

The refrigerated medium is moved through the tube by means of a pump. The pump is preferably set such that the refrigerated medium flows through the tube very slowly, for example at a speed of for example about 5 metres per minute.

For the refrigerated medium, an empty tube is connected to the tube at the end remote from the charging station, the refrigerated medium being returned to the charging station through said empty tube. Arranged in the charging station is a cooling unit which cools the refrigerated medium returned via the empty tube down to the required operating temperature again and feeds it to the storage tank.

BRIEF DESCRIPTION OF THE DRAWINGS

Exemplary embodiments of the subject matter of the invention are illustrated in the drawings, in which.

DETAILED DESCRIPTION

Figure 1:
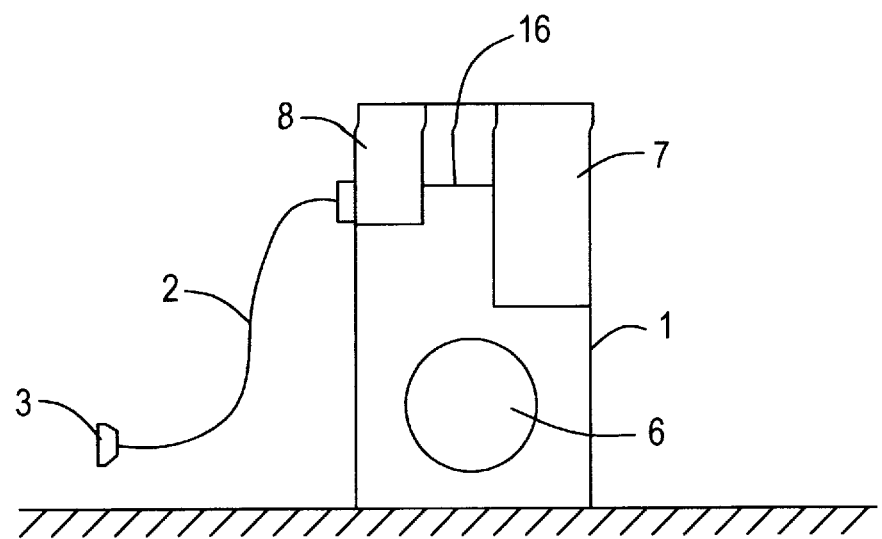
FIG. 1 shows a schematic illustration of a charging station for electric current.

FIG. 1 schematically illustrates a charging station 1 which serves to recharge a battery of a vehicle. Such a charging station is constructed, using known technology, for example in the region of filling stations or in multi-story carparks or parking bays.

Figure 2:
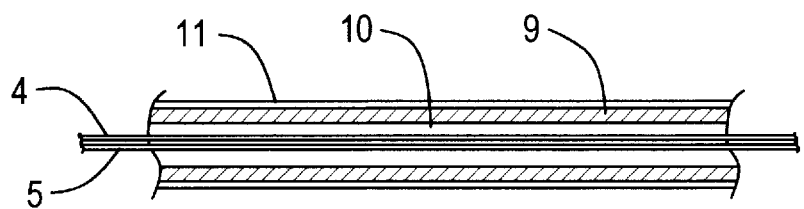
FIG. 2 shows a portion of a line connected to the charging station in cross section.
Figure 3:
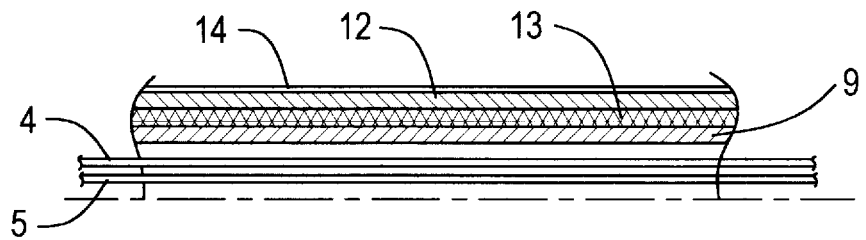
FIG. 3 shows a line which is completed in comparison to FIG. 2.
Figure 4:
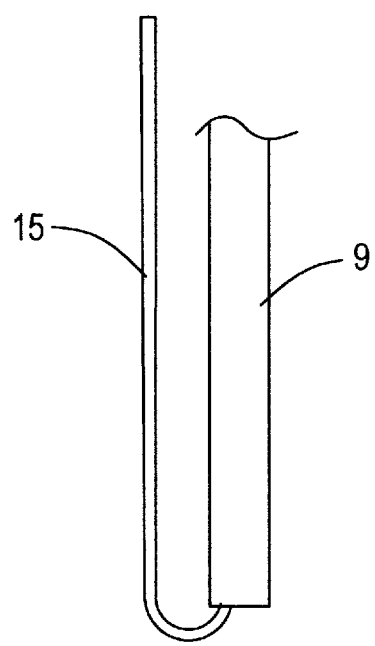
FIG. 4 shows a detail of the arrangement according to the invention in a purely schematic illustration.

Connected to the charging station 1 is an electric line 2, to the free end of which an electrical coupling part 3 is attached. The coupling part 3 is advantageously a plug, which can be connected to a socket, present in the vehicle, as a complementary coupling part. Arranged in the line 2 are at least two insulated electrical conductors 4 and 5 (FIGS. 2 and 3). Electrical components of the charging station, for example an AC/DC converter, are schematically indicated in FIG. 1 by a circle 6. Fitted in the charging station 1 are a storage tank 7 and also, in the exemplary embodiment illustrated, a cooling unit 8.

According to FIG. 2, the line 2 has the two insulated electrical conductors 4 and 5. These consist for example of copper or aluminium. The two conductors 4 and 5 are surrounded along their entire length by a readily flexible tube 9 that consists of metal and, in addition to the two conductors 4 and 5, also surrounds a cavity 10 that is present along its entire axial length. The tube 9 is surrounded along its entire length by thermal insulation 11. In order to improve its flexibility, it is corrugated transversely to its longitudinal direction, specifically helically or annularly.

A flowable, refrigerated medium—referred to just as "medium" below—is permanently passed through the cavity 10, said medium being refrigerated to a temperature of at least −160° C. Preferably, nitrogen is used as the medium. The medium is contained in the storage tank 7, which is arranged in a thermally insulated manner in the charging station 1. It is accessible from the outside, such that the medium can always be recharged up by a supplier if necessary.

The medium is drawn from the storage tank 7 by means of a pump (not illustrated) and is pumped into the tube 9 at a low speed, such that it is moved through the latter. The two conductors 4 and 5 have an electrically conductive cross section which corresponds to about 10% of the cross section that is required in conventional conductors and at normal ambient temperature of for example 20° C. to transmit electrical currents at a very high current intensity. These are currents of for example 5 kA.

The medium cools the conductors 4 and 5 down to a temperature corresponding to the temperature of the same of at least −160° C. The electrical resistance of said conductors 4 and 5 drops as a result to about 10% of the value that exists at ambient temperature. The cross section of the conductors 4 and 5 can accordingly be reduced to 10% of that of conductors which are used at ambient temperature. The line 2 is accordingly lighter. Its weight including the tube 9 is about 20% that of a conventional line. The line 2 can accordingly be handled more easily.

The tube 9 is completed to, according to FIG. 3, to form a cryostat known in cryogenics. The interior of the tube 9 is, as a result, protected better from the action of heat from the outside. The medium moved in the tube 9 then maintains its low temperature for a longer time and can accordingly be moved more slowly though the tube 9.

The abovementioned cryostat is realized by a flexible outer tube 12 which surrounds the tube 9 along its entire length, with insulation 13 being enclosed therein. The outer tube 12 likewise consists of metal and is likewise corrugated transversely to its longitudinal direction. Over the outer tube 12, a closed layer 14 of insulating material is applied. The space between the tube 9 and the outer tube 12 is evacuated.

The medium is moved through the cavity 10 of the tube 9. Connected to the tube 9, or to the cavity 10 thereof, is an empty tube 15 which projects into the charging station 1 and through which the medium is returned into the charging station 1. In the charging station 1, it is connected to the cooling unit 8, in which it is cooled down to its operating temperature again. It can then be passed into the storage tank 7 via a pipeline 16.

The invention claimed is:

1. Arrangement for supplying power to a motor vehicle the vehicle being equipped with an electric motor and in which there is arranged at least one rechargeable electric battery to which the electric motor is connected, said arrangement comprising:

a stationary charging station which is equipped with an electric power source and to which an electric line having at least two mutually insulated electrical conductors is connected, a part of an electrical coupling for connecting to a complementary coupling part present on or in the motor vehicle being attached to the free ends of said electrical conductors, said coupling part being connected to the battery in an electrically conductive manner, wherein the electric line is surrounded along its entire axial length by a tube which is closed all around and which, in addition to the line, encloses a cavity along its entire axial length, wherein a flowable medium refrigerated to a temperature of at least −160° C. is contained in the space enclosed by the tube, and wherein a thermally insulated storage tank containing a store of the refrigerated medium is arranged in the charging station, the tube being connected to said storage tank, wherein in that the tube is a thermally insulated and flexible tube made of metal, in that the tube is surrounded by a flexible outer tube that likewise consists of metal, with thermal insulation being enclosed therein, in that the space between the tube and outer tube is evacuated, in that the tube and the outer tube are corrugated transversely to their longitudinal direction, in that a pump for moving the refrigerated medium through the tube is arranged in the charging station, and in that the tube is equipped with an empty tube for returning the refrigerated medium to the charging station.

2. Arrangement according to claim 1, wherein a cooling unit, to which the empty tube is connected and which is connected to the storage tank via a pipeline, is arranged in the charging station.

\* \* \* \* \*